United States Patent [19]

Feldstein et al.

[11] 3,878,007

[45] Apr. 15, 1975

[54] METHOD OF DEPOSITING A PATTERN OF METAL PLATED AREAS ON AN INSULATING SUBSTRATE

[75] Inventors: Nathan Feldstein, Kendall Park; Harold Bell Law, Princeton, both of N.J.

[73] Assignee: RCA Corporation, New York, N.Y.

[22] Filed: June 6, 1973

[21] Appl. No.: 367,541

Related U.S. Application Data

[62] Division of Ser. No. 200,156, Nov. 18, 1971, Pat. No. 3,753,816.

[52] U.S. Cl. .................... 156/11; 156/13; 96/36.2; 117/212

[51] Int. Cl. .......................................... B29c 17/08

[58] Field of Search ......... 117/212; 156/11; 96/36.2

[56] References Cited

UNITED STATES PATENTS

| | | | |
|---|---|---|---|
| 3,573,549 | 4/1971 | Drotar et al. | 117/212 |
| 3,748,109 | 7/1973 | Lee | 117/212 |
| 3,753,816 | 8/1973 | Feldstein et al. | 156/11 |

*Primary Examiner*—John D. Welsh
*Attorney, Agent, or Firm*—Glenn H. Bruestle; William S. Hill

[57] ABSTRACT

The method comprises depositing a thin layer of a first metal having a relatively high degree of solubility in a particular etchant on a substrate, this first metal being catalytic to electroless deposition of a second metal to be subsequently deposited, electrolessly depositing on the first metal a pattern of areas of a second metal which has a relatively low degree of solubility in the etchant, and then treating the plated areas with the etchant, so that the first metal is removed where it is not covered by the second metal but the second metal is substantially unaffected.

8 Claims, 4 Drawing Figures

METHOD OF DEPOSITING A PATTERN OF METAL PLATED AREAS ON AN INSULATING SUBSTRATE

Figure 1:
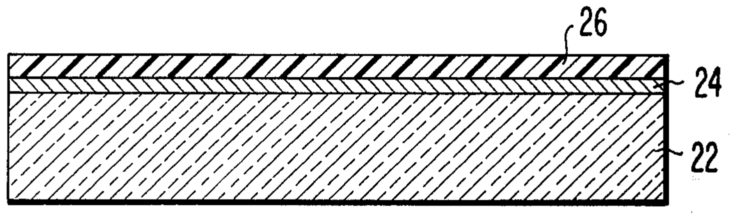
Figure 2:
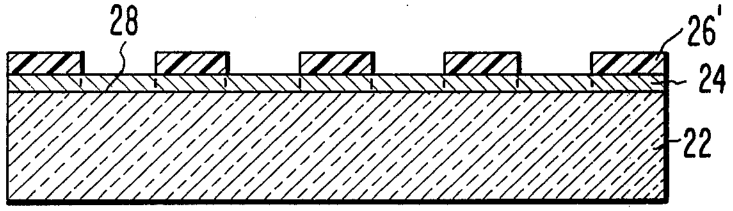
Figure 3:
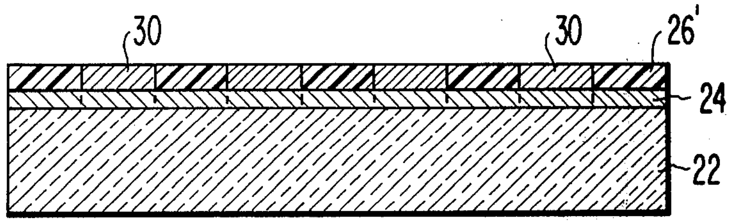

This application is a Division of Application Ser. No. 200,156 filed Nov. 18, 1971, now issued U.S. Pat. No. 3,753,816.

BACKGROUND

There are numerous industrial applications which require forming a pattern of metal plated areas on an insulating substrate. One such application is printed circuits. Another application is making metal photomasks. Photomasks may be used in many different manufacturing operations such as the fabrication of the shadow mask used in a color TV picture tube.

It was known that masks can be made from evaporated or sputtered chromium and that these have a harder surface than photographic emulsions. But evaporated or sputtered chromium masks were not found suitable for making picture tube shadow masks. Large size picture tubes have correspondingly large size shadow masks and evaporation and sputtering equipment for making this size metal mask is expensive. Furthermore, because of the large area, evaporated coatings tend to be nonuniform in thickness. It was also found that if chromium masks were made thick enough to compensate for nonuniformity, the chromium became much less resistant to abrasion.

It was found that improved photomasks could be made by electroless deposition of nickel alloy on glass substrates. It was found that this type of mask could be made with satisfactory resolution, good uniformity, with good adherence to substrate and good abrasion resistance. In fact, it was found that thicker layers of nickel had higher abrasion resistance than thinner layers.

In making a metal pattern, however, it was found that there was still room for a method which would provide better resolution along with good adherence and strain-free coating when the metal layer was relatively thick. In methods which require etching of a relatively thick metal coating using a photoresist to define the areas to be removed by etching, the photoresist often has pinholes through which etching fluid penetrates and removes metal from areas where it is supposed to remain.

Past methods of making metal photomasks by electroless deposition of nickel have been based on depositing an overall layer of nickel having the final thickness desired, on a glass substrate and by a conventional photoresist exposing and developing process, followed by etching away unwanted metal, arriving at the final pattern desired. Since the coating of metal must be thick enough to be opaque to light, i.e., at least about 1,500 A, some lateral etching occurs in addition to the vertical etching desired. Although the amount of lateral etching can be tolerated in making photomasks for shadow mask manufacture, better resolution is desirable. This appears to be possible by using an additive process of metal deposition rather than a subtractive one. However, past attempts to devise an additive process comprising first sensitizing and activating the substrate for autocatalytic electroless deposition of metal, then coating with a conventional photoresist, exposing and developing the photoresist to provide a pattern of openings where metal is to be deposited and then electrolessly depositing metal in these openings, have been unsuccessful. Lack of success is due to the fact that the photoresist and the processing to which it is normally subjected in development, poison the palladium activator film (or any other monolayer activator film) deposited on the substrate, thus preventing metal from being deposited autocatalytically. This is particularly critical when fine line resolution is involved.

The present invention is an additive process which solves the problem of catalyst poisoning previously encountered.

SUMMARY OF THE INVENTION

The invention is a method of depositing a pattern of metal plated areas on an insulating substrate. The invention comprises depositing, for example, by electroless deposition, a relatively thin layer of a first metal having a relatively high degree of solubility in a particular etchant, on the substrate, the first metal being catalytic to electroless deposition of a second metal to be subsequently deposited, applying a layer of photoresist on top of the first metal layer and exposing and developing the photoresist to remove portions thereof only where additional metal is to be deposited. The method also includes electrolessly depositing on those metal portions not covered with resist a relatively thick layer of a second metal which has a relatively low degree of solubility in the particular etchant, removing all remaining portions of the photoresist, and treating the pattern with the etchant so that the first metal is removed where it is not covered by the second metal, and the second metal is not removed.

THE DRAWINGS

FIGS. 1–4 are similar cross-section views illustrating the successive steps in making a metal photomask in accordance with the method of the invention.

The method of this invention can be used to advantage in depositing the original pattern of dots in a metal photomask. Referring now to FIG. 1, a glass substrate 22 which is to have a pattern of dots deposited on a surface thereof, has deposited on this surface a thin coating 24 of a metal having relatively low resistance to attack by an etchant such as 15% hydrochloric acid. This can be about 100 – 500 A of nickel-boron deposited as follows:

The complete process (not a part of the present invention) includes sensitizing and activating the surface to be plated prior to depositing the metal. Sensitization is carried out by dipping the cleaned glass plate in a solution of $SnCl_2.2H_2O$, HCl and water. The sensitizing solution may be made by first making a concentrate consisting of 214 gms. $SnCl_2.2H_2O$ and 290 cc. Conc. (37%) HCL. The actual sensitizing solution comprises 50 cc. of the concentrate diluted to one liter with water. Immersion of the glass plate in the sensitizing solution for one or two minutes is sufficient. After the sensitization step, the plate is rinsed thoroughly with warm water.

The sensitized surface is next activated with a solution of palladium chloride. The activating solution consists of 1 gram per liter of palladium chloride and 1 cc. per liter of concentrated hydrochloric acid. The remainder of the solution is water. The plate is again rinsed with water after treatment with the activating solution for a brief period.

To deposit the metal layer the sensitized and activated substrate is dipped in a bath made up of:

| | | |
|---|---|---|
| $Na_4P_2O_7.10H_2O$ | 50 | g./L |
| $NiSO_4.6H_2O$ | 25 | g./L |
| $NH_4OH$ (approx. 58% Conc.) | 20 | cc./L |
| $(CH_3)_2NH\ BH_3$ | 1.5 | g./L |

This bath operates at room temperature. When a nickel-boron layer about 100 – 500 A is deposited, the plate is removed from the bath and thoroughly rinsed, then dried. Plating takes about 30 – 45 seconds.

Applicants have found that the nickel-boron layer 24 should be less than about 500 A thick and preferably from about 100 – 500 A thick. If the layer is too thick its adherence is very poor and it peels away from the substrate. On the other hand it must be at least thick enough so that it is not impaired when it is subsequently covered with a photoresist and parts of the photoresist are removed by solvent action. The nickel-boron layer is so thin as to be highly electrically resistive. Therefore it is not possible to successfully electroplate an additional thickness of metal directly upon it.

A layer of photoresist 26 is deposited on top of nickel-boron layer 24.

A pattern of openings 28 (FIG. 2) corresponding to the desired pattern of metal dots is then formed by exposing and developing the photoresist layer. The remainder 26' of the original photoresist layer 26 forms a lattice work matrix for the openings 28.

Next (FIG. 3) the openings 28 are filled in by electrolessly depositing a nickel-phosphorus layer from a sulfamate bath as follows:

This metal deposition may be done by immersing in or dispensing into the assembly a bath comprising:

| | |
|---|---|
| $N^{++}$ (from concentrated nickel sulfamate) | 2.0 g./L |
| $NaH_2PO_2.H_2O$ | 20 g./L |
| pH | about 5.0 |
| Temperature | 50°–90° C. |

Plating usually starts within one minute. Usually there is no need to sensitize or activate the surface within the openings 28 since the previously deposited nickel-boron layer is autocatalytic to the deposition of nickel. If some activation is required it can be produced by briefly treating the surface with a 10% aqueous hydrochloric acid solution. Plating is continued until the combined thickness of the thin, underlying nickel layer 24 and of the newly deposited nickel-phosphorus layer is sufficient to be opaque to visible light. Thickness should be at least about 1,500 A.

This forms metal dots 30 on top of the nickel-boron layer 24.

Figure 4:
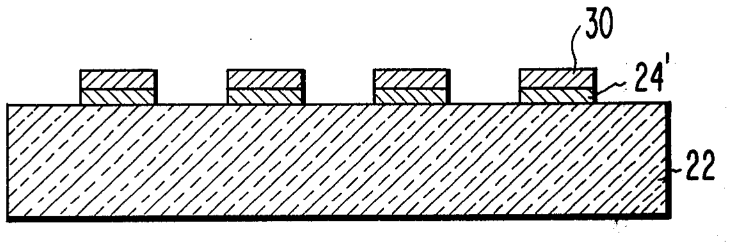

As shown in FIG. 4, the remainder 26' of the photoresist layer is dissolved. Then that part of the nickel boron layer 24 not shielded by nickel-phosphorus dots 30 is removed by etching the entire surface with 15% hydrochloric acid leaving a dot pattern in which each dot is composed of a thin bottom layer 24' of nickel-boron and a top layer 30 of nickel-phosphorus.

One of the advantages of this method is that, first of all, the dots are mostly formed by building up metal rather than by etching. Only the lower very thin layer of metal 24 is removed by treating with an etchant. When etching is used to define dots or other elements in a relatively thick layer of metal, the dots tend to have sloping sides since etching occurs laterally as well as vertically.

Another advantage is that the thin bottom layer can be selected for good adherence properties and little regard for hardness. Only the top layer need be selected for abrasion resistance. Also the method almost entirely eliminates the effect of pinholes usually present in layers of developed photoresist due to presence of unavoidable dirt particles.

The method can also be used to deposit metal patterns on insulating substrates other than glass. when plastics such as Mylar are used, the plating conditions are the same as given in the above examples. In using photoresists for masking purposes, however, it must be remembered to keep baking temperatures below that which would damage the plastic.

Combinations other than the nickel-boron first layer and nickel-phosphorus second layer, described above, can be used in the method of the invention. For example, the thin, low-etch resistant first layer may be a low-phosphorus content nickel-phosphorus alloy and the high-etch-resistant top layer may be made of a high-phosphorus content nickel-phosphorus alloy. The low-phosphorus layer may be made by electrolessly depositing nickel from a bath comprising:

| | |
|---|---|
| $Na_4P_2O_7.10H_2O$ | 50 g./L |
| $NiSO_4.6H_2O$ | 25 g./L |
| $NH_4OH$ (approx. 58% Conc.) | 20 cc./L |
| $NaH_2PO_2.H_2O$ | 25 g./L |

This bath operates at room temperature and provides a nickel-phosphorus alloy deposit having less than 5% phosphorus. The layer is rapidly etched by dilute hydrochloric acid solutions.

The high-phosphorus coated layer is deposited as described in the previous example.

Another example is a combination of a first layer made of a low-phosphorus content cobalt-boron alloy and a second layer made of a high-phosphorus content cobalt-phosphorus alloy. The low-phosphorus content layer can be electrolessly deposited using the following composition:

| | | |
|---|---|---|
| $Na_4P_2O_7.10H_2O$ | 70 | g./L |
| $CoSO_4.7H_2O$ | 50 | g./L |
| $NH_4OH$ (approx. 58% Conc.) | 7.5 | cc./L |
| $CH_3NH\ BH_3$ | 1.5 | g./L |

The bath operates at room temperature.

The high-phosphorus content cobalt-phosphorus layer may be deposited from a composition like that immediately above except that 25 g./L of $NaH_2PO_2.H_2O$ is substituted for the methyl amine borane and the bath is operated at 65°C.

Another combination is a first layer composed of a low-phosphorus (less than 5%) nickel-phosphorus alloy and a second layer composed of a high-phosphorus (at least about 8% phosphorus) cobalt-phosphorus alloy.

Another example is to use a first layer of evaporated or sputtered nickel or cobalt. Such layers are relatively pure metal and are relatively soluble in dilute hydrochloric acid. High phosphorus content nickel or cobalt alloys can be used for the second layer as in the previous examples.

When a "relatively thin layer of a first metal" is referred to herein, it is meant to exclude the palladium activator layer which is actually so very thin as to be discontinuous. The palladium is present substantially as a monolayer not having a measurable thickness.

Etchants other than dilute hydrochloric acid can be used to remove the thin layer of first metal. It has been found, for example, that 3% (by volume) nitric acid can also be used with all of the metal combinations mentioned.

We claim:

1. A method of depositing a pattern of metal plated areas on an insulating substrate comprising:

depositing a relatively thin layer of a first metal having a relatively high degree of solubility in a particular etchant on a surface of said substrate, said first metal being catalytic to electroless deposition of a second metal to be subsequently deposited, applying a layer of photoresist on said first metal layer, exposing and developing said photoresist to remove portions thereof so as to define a desired pattern on the surface of said first metal layer, electrolessly depositing on said defined surface areas of said first metal layer, a relatively thick layer of said second metal, said second metal having a relatively low degree of solubility in said etchant, removing the remaining portions of said photoresist, and treating the entire surface to be patterned with said etchant to remove only those areas of said first metal not covered with said second metal.

2. A method according to claim 1 in which said layer of first metal is less than about 500 A thick.

3. A method according to claim 2 in which the total thickness of said first and second metals is at least about 1,500 A.

4. A method according to claim 1 in which said substrate is sensitized and activated and said first layer of metal is deposited electrolessly.

5. A method according to claim 1 in which said first metal is a nickel-boron alloy and said second metal is a nickel-phosphorus alloy.

6. A method according to claim 1 in which said layer of first metal is composed of a nickel or cobalt alloy having less than about 5% phosphorus and said second metal is a high-phosphorus content alloy of nickel or cobalt.

7. A method according to claim 1 in which said substrate is glass and said first and second metals are different nickel alloys.

8. A method according to claim 7 in which said etchant is a dilute aqueous solution of hydrochloric acid.

* * * * *